United States Patent [19]

Kitamura et al.

[11] Patent Number: 4,701,354

[45] Date of Patent: Oct. 20, 1987

[54] PROCESS FOR SURFACE TREATMENT OF METAL MATERIALS

[75] Inventors: Yoichi Kitamura; Hisashi Hotta, both of Yokohama; Toshimasa Kodaira, Tokyo, all of Japan

[73] Assignee: Toyo Seikan Kaisha, Ltd., Tokyo, Japan

[21] Appl. No.: 800,135

[22] Filed: Nov. 20, 1985

[51] Int. Cl.⁴ .............................................. C23C 16/00
[52] U.S. Cl. ................... 427/255.6; 427/318; 427/388.1; 427/405; 427/409
[58] Field of Search .................. 427/255.6, 348, 419.2, 427/384, 405, 388.1, 388.2, 327, 409

[56] References Cited

U.S. PATENT DOCUMENTS 3,068,119 12/1962 Gotsch ............................ 427/388.1
3,434,873 3/1969 Harrod ............................ 427/388.2
4,392,582 7/1983 Kitamura et al. ................ 428/418

FOREIGN PATENT DOCUMENTS 560441 7/1958 Canada ............................ 427/255.6

Primary Examiner—Sadie L. Childs
Attorney, Agent, or Firm—Sherman and Shalloway

[57] ABSTRACT

A very thin coating layer having a thickness of the order of angstroms of a hydroxymethyl substituted phenol is applied to the surface of a metal material. The hydroxylmethyl substituted phenol, such as saligenin, is applied in the gaseous phase to the surface of the metal material maintained at a high temperature.

By forming this ultra-thin coating layer, the heat bondability of a thermoplastic resin layer to the metal material can be effectively improved. This technique is advantageously used in various fields, for example, for production of bonded cans.

8 Claims, 3 Drawing Figures

PROCESS FOR SURFACE TREATMENT OF METAL MATERIALS

BACKGROUND OF THE INVENTION

1. Field of the Invention

The present invention relates to a technique of forming on the surface of a metal a coating layer having a thickness of the angstrom order, which is much smaller than the thickness of a layer of a conventional so-called adhesive primer, by applying to the surface of the metal an adhesive molecule capable of being tightly bonded to the metal surface.

2. Description of the Prior Art

Formation of a strong bonding between a metal and a thermoplastic resin layer is eagerly desired in various fields.

For example, in the field of the can-manufacturing industry, can bodies are often obtained by lapping both the end portions of a metal blank for a can through a thermoplastic adhesive such as a polyamide and heat-bonding the lapped end portions. When the end portions of a metal blank are bonded through a thermoplastic adhesive, the bonding strength between the surface of the metal blank and the thermoplastic adhesive is not sufficiently high and the adhesion tends to be degraded with the lapse of time. As means for solving this problem, there is ordinarily adopted a method in which an adhesive primer such as an epoxy-phenolic resin is coated and baked on a metal material and heat bonding with a thermoplastic resin adhesive is effected through this adhesive primer layer.

However, an epoxy-phenolic lacquer is relatively expensive and the operation of applying this lacquer in the form of a coating layer to the surface of metal material is troublesome. Moreover, since the lacquer has to be applied as a solution in an organic solvent, the solvent cost and the energy cost for baking become increased, and since discharge of the organic solvent in the open air is not allowed, an environmental pollution-preventing equipment such as an after-burner becomes necessary.

Strong bonding between a thermoplastic resin and a metal material is also desired strongly in the field of film-laminated steel plates which are used instead of conventional coated steel plates. Also in this case, the above-mentioned problems similarly arise.

SUMMARY OF THE INVENTION

It is a primary object of the present invention to provide a process for the surface treatment of a metal material in which only by applying a very simple operation to the surface of the metal material, the adhesion or bonding strength between the metal material and a thermoplastic resin layer can be enhanced.

Another object of the present invention is to provide a process for the surface treatment of a metal material in which the degradation of the adhesion with the lapse of time is prominently reduced as compared with the case where a conventional adhesive primer is applied to the surface of the metal material.

Still another object of the present invention is to provide a process for the surface treatment of a metal material in which by forming a treatment layer which is much thinner than a conventional adhesive primer layer by a very simple operation, the heat bondability of a thermoplastic resin layer to the metal material can be highly improved.

A further object of the present invention is to provide a surface-treated steel plate or bonded structure formed by the above-mentioned surface treatment process, such as a bonded can which is valuably used in the field where a content is hot-filled or is retort-sterilized after filling.

In accordance with one fundamental aspect of the present invention, there is provided a process for the surface treatment of metal materials, which comprises applying a hydroxymethyl substituted phenol in the gaseous phase to the surface of a metal material maintained at a high temperature.

In accordance with another aspect of the present invention, there is provided a surface-treated steel plate excellent in the adhesion, which comprises a steel plate substrate, a chromium-containing coating layer formed on the surface of the steel plate substrate, which is composed of metallic chromium, non-metallic chromium or a mixture thereof, and an ultra-thin layer bonded to the surface of the chromium-containing coating layer, which is composed of hydroxymethyl group-containing phenol or a polycondensate thereof.

In accordance with still another aspect of the present invention, there is provided a bonded structure comprising a metal material bonded through a polyamide type adhesive, wherein the metal material has a bonded thin layer of a hydroxymethyl group-containing phenol on at least one outermost surface, to be bonded, of the metal material.

DETAILED DESCRIPTION OF THE PREFERRED EMBODIMENT SURFACE TREATMENT PROCESS

Figure 1:
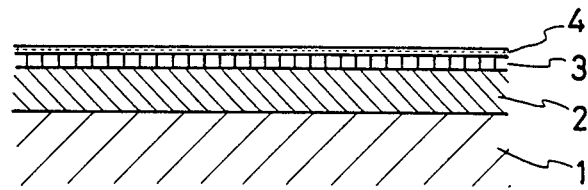
FIG. 1 is a sectional view illustrating a surfacetreated steel plate according to the present invention.

The hydroxymethyl substituted phenol used in the present invention has a chemical structure characterized in that a phenolic hydroxyl group and a hydroxymethyl group are present on the nucleus.

If this hydroxymethyl substituted phenol is applied in the form of a vapor to the surface of a metal material maintained at a high temperature, the adhesion strength to a resin layer is highly improved and this high adhesion strength is maintained even after the lapse of time. the degradation of the bonding strength between a thermoplastic resin layer and a metal material with the lapse of time can be evaluated according to a method in which this laminate is immersed in a dilute aqueous solution of citric acid at a high temperature. For example, a seam of a can body formed by coating a known epoxy-phenolic resin type primer on an electrolytically chromate-treated steel plate (tin-free steel) and bonding the edge portions of the primer-coated steel plate through a nylon type adhesive tape has an initial bonding strength of 6 to 7 kg per 5 mm of the width, but if the can body is immersed for 96 hours at the above-mentioned accelerated degradation test, the bonding strength is reduced to 1.1 to 1.3 kg per 5 mm of the width. In contrast, a seam of a can body obtained by treating the surface of the tin-free steel plate with a vapor of saligenin (o-hydroxybenzyl alcohol) and performing the lap bonding through the same nylon type adhesive has an initial bonding strength similar to the above-mentioned initial bonding strength and even after 96 hours' immersion in the citric acid solution, the bonding strength is maintained at a level of 4.4 to 4.5 kg per 5 mm of the width. Thus, it has been clarified that by the surface treatment with a hydroxymethyl substituted phenol, the degradation of the bonding strength with the lapse of time is prominently controlled.

For the initial bonding strength and the bonding strength after the lapse of time, it is important that the surface-treating agent used in the present invention should have both the hydroxymethyl group and the phenolic hydroxyl group as the substituents on the nucleus. For example, when the metal surface is treated with a vapor of a compound having only a phenolic hydroxyl group, such as p-cresol or phenol, the initial bonding strength of the obtained bonded structure is considerably low, and only when a surface-treating agent having not only a phenolic hydroxyl group but also a hydroxymethyl group is used, a high bonding strength and a high bonding strength retention after the lapse of time can be obtained.

When the cause of the degradation of the adhesion strength between the metal surface and the coating layer formed thereon with the lapse of time is examined, it is deemed necessary to take not only a factor of the adhesion of the bonded portion but also a factor of the water resistance into consideration. The reason why a high initial bonding strength and a high resistance against the degradation of the bonding strength with the lapse of time can be obtained according to the present invention has not been completely elucidated, but it is considered that by adhesion of the vapor of the surface-treating agent to the metal surface maintained at a high temperature, chemical bonding to the metal surface is produced and the above-mentioned characteristics are improved by this chemical bonding.

The surface-treating agent used in the present invention has at least one phenolic hydroxyl group and at least one hydroxymethyl group, and any of compounds having at least one phenolic hydroxyl group and at least one hydroxymethyl group can be used, so far as they are converted to vapors at high temperatures. Preferred examples of the surface-treating agent are described below, though compounds that can be used in the present invention are not limited to those exemplified below.

(1) Hydroxymethyl substituted phenols represented by the following general formula:

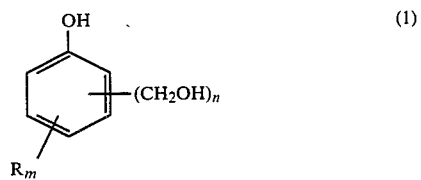

wherein R stands for a hydrogen atom, an alkyl group, a hydroxyl group or a phenyl group, n is an integer of from 1 to 3, and m is an integer of from 1 to 3, with the proviso that the sum of m and n does not exceed 5, and it is preferred that the hydroxymethyl group be bonded at the ortho- or para-position to the phenolic hydroxyl group, such as saligenin, o-hydroxymethyl-p-cresol, p-hydroxymethyl-o-cresol, o-hydroxymethyl-p-t-butylphenol, o-hydroxymethyl-p-phenylphenol, di(o-hydroxymethyl)-p-cresol, 2,4-dihydroxymethyl-o-cresol, 2,4-dimethyl-6-hydroxymethylphenol, resorbinol, catechol, and mono- or di-hydroxymethyl hydroquinone.

(2) Hydroxymethyl substituted binuclear phenols represented by the following general formula:

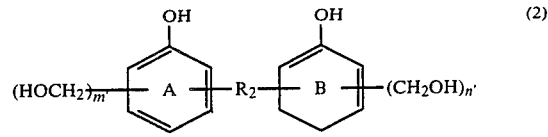

wherein $R_2$ stands for a direct bond or a divalent bridging group, each of n' and m' is an integer of up to 2 inclusive of 0, with the proviso that the sum of n' and m' is an integer of at least 1, and rings A and B may be substituted with a methyl group.

As preferred examples of the bridging group $R_2$ in the formula (2), there can be mentioned a methylene group, a methylene-oxymethylene group ($-CH_2-O-CH_2-$), an ethylidene group, a 2,2-propylidene group

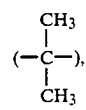

an oxygen atom ($-O-$), a sulfur atom ($-S-$), a sulfonyl group

and an imino group ($-NH-$).

Furthermore, hydroxymethyl derivatives of naphthols, such as 2-hydroxymethyl-1-naphthol and 2,4-dihydroxymethyl-1-naphthol, may be used. Of course, hydroxymethyl tri-nuclear phenols may be used for attaining the objects of the present invention. However, as the number of benzene rings is increased, the vapor pressure is reduced and the amount generated of the vapor is decreased when compared at the same temperature. Accordingly, it is preferable to use a mononuclear or bi-nuclear compound, especially a mononuclear compound.

It is preferred that the molecular weight of the hydroxymethyl substituted phenol be 124 to 320, especially 124 to 260. In view of the adhesion and the adaptability to the surface-treating operation, a mononuclear or bi-nuclear phenol having one hydroxymethyl group at the ortho- or para-position to the phenolic hydroxyl group and other substituent at the remaining ortho- or para-position is preferred.

The metal material to be surface-treated in the present invention may be an optional metal material in the form of a foil or a plate. For example, there can be mentioned a steel plate, a soft iron plate, a stainless steel plate, an aluminum plate, a copper plate, a brass plate and other light metal plates, these metal plates melt-deposited or electrically deposited with different metals such as tin, zinc, copper, chromium, nickel and aluminum, and chemically treated metal plates obtained by chemically or cathodically treating the surfaces of the foregoing metal plates with chromic acid and/or phosphoric acid. Furthermore, plates obtained by anodically treating the foregoing metal plates can be used. Of course, an iron foil, a steel foil, an aluminum foil, a copper foil, metal foils treated with phosphoric acid and/or chromic acid, and iron and steel foils deposited with tin, zinc, copper, chromium or nickel may be used.

In view of the initial bonding force to the thermoplastic resin layer and the maintenance of the bonding force even after the lapse of time, it is important that the hydroxymethyl substituted phenol should be applied in the gaseous phase to the surface of the metal material maintained at a high temperature. For example, in the case where the hydroxymethyl substituted phenol is applied to the surface of a metal material by spray coating or the like, the obtained bonding force is smaller than about ½ of the bonding force attained by applying the hydroxymethyl substituted phenol in the form of a vapor. Moreover, according to the present invention, by applying the hydroxymethyl substituted phenol in the form of a vapor to the surface of the metal material, there is attained a prominent advantage in that a high adhesion-enhancing effect can be attained only by applying the hydroxymethyl substituted phenol in a thickness much smaller than the thickness of the conventional coating layer, that is, a thickness of 1 to 100 Å, especially 1 to 30 Å. Incidentially, the thickness is determined by measuring the intensity of the photoelectrica spectrum at 1S of the carbon as the constituent element of the treatment film on the surface of the treated metal by the electron spectroscopy for the chemical analysis (hereinafter referred to as "ESCA"), comparing this intensity with that of a reference sample formed by vacuum deposition of carbon and calculating the film thickness x according to the following formula:

$$x = -\lambda_c \sin\theta \cdot \ln\left(1 - \frac{I_c}{I_c^s}\right)(\rho_c^s/\rho_c)$$

wherein x stands for the thickness of the organic substance layer, $I_c^s$ stands for the spectral strength of the vacuum-deposited carbon, $I_c$ stands for the spectral strength of the sample, $\rho_c^s$ stands for the atomic carbon concentration of the vacuumdeposited carbon, which is equal to 0.1875 mole/cm$^3$, $\rho_c$ stands for the atomic carbon concentration of the sample (organic substance), which is equal to 0.0654 mole/cm$^3$, $\theta$ stands for the photo-electron emission angle, which is equal to 90°, sin $\theta$ is therefore 1, and $\lambda_c$ stands for the average escape depth of photo-electron, which is equal to 18.1 Å. Incidentally, since there is present an organic substance adhering to the metal material, the blank test is carried out in advance to determine the thickness of this organic substance, and the treatment thickness is calculated by subtracting the thickness obtained at the blank test from the above thickness.

In view of the bonding force, it is important that the surface of the metal material should be maintained at a high temperature. If the temperature is too low, the bonding force to the thermoplastic resin is drastically reduced.

It is preferred that the treatment with the hydroxymethyl substituted phenol be carried out in the state where the surface of the metal material is maintained at a temperature of at least 150° C., especially 180° to 300° C., particularly especially 200° to 250° C. If the temperature is lower than 150° C., the degree of the improvement of the bonding force is lower than the improvement degree attained when the temperature is in the above-mentioned range. The temperature practically adopted depends on the kind of the hydroxymethyl substituted phenol used, and in case of the substituted phenol having a higher molecular weight, a higher temperature is preferred.

Various means may be adopted for applying the hydroxymethyl substituted phenol in the gaseous phase to the surface of the metal material. According to a simplest method, the hydroxymethyl substituted phenol is placed in a high-temperature atmosphere to generate a vapor of the substituted phenol, and the metal material is exposed in the atmosphere filld with the vapor. The above-mentioned hydroxymethyl substituted phenols can be used singly or in the form of a mixture of two or more of them. The substituted phenol may be supplied to the high-temperature atmosphere in the state of the bulk, that is, in the non-diluted state, or it may be supplied in the diluted state, for example, in the form of a solution, emulsion or suspension in water or an organic solvent. Moreover, the substituted phenol may be supplied in the surface area-increased state where the substituted phenol is supported on a carrier such as an inorganic pigment, a filler, gel particles or glass beads. Namely, it must be understood that in the present invention, the shape and composition of the carrier are not particularly critical, so far as a vapor of the hydroxymethyl substituted phenol is produced. For example, there may be adopted a method in which a hydroxymethyl substituted phenol is incorporated in a lacquer solution to be applied to one surface of a metal plate or metal foil, and many one-surface-coated metal plates or foils are arranged at small intervals in a high-temperature atmosphere to treat the surfaces opposite to the coated surfaces of the metal plates or foils with a vapor of the hydroxymethyl substituted phenol.

The treatment can be carried out batchwise or in a continuous manner. For example, there may be adopted a method in which a coil or sheet of a metal foil or plate is continuously supplied into a tunnel-type heat treatment furnace to effect treatment with the vapor, or a method in which a predetermined amount of a metal material is introduced in a treatment furnace, the treatment furnace is sealed and the vapor is filled in the treatment furnace.

In each method, hot air containing a vapor of a hydroxymethyl substituted phenol is prepared in or outside the treatment furnace, and this hot air is circulated in the treatment furnace to effect the vapor treatment.

The time required for the gaseous phase treatment with the hydroxymethyl substituted phenol depends on the concentration of the vapor in the gaseous phase or the temperature, and the treatment time is not particularly critical so far as a coating layer having the above-mentioned thickness is formed. Namely, an optional time can be adopted according to the treatment temperature and vapor concentration conditions. The thickness of the covering layer is very small, and since by forming a covering layer having a thickness exceeding the above-mentioned range, no particular advantage is attained, even if the treatment is conducted for more than 10 minutes, no particular advantage is attained and the process is economically disadvantageous.

The surface treatment process of the present invention is especially advantageously used for enhacing adhesion or bonding of a thermoplastic resin such as a polyamide, a polyester, an acid-modified polyoleifn, an acrylic resin, a vinyl resin or a polycarbonate to the surface of a metal material.

Ordinarily, the surface of a metal material as described above is treated with an oiling agent such as dioctyl sebacate or cotton seed oil. The surface treatment of the present invention may be applied to not only a metal material having such an oiling agent layer thereon but also a material from which the oiling agent layer has been removed by a degreasing treatment.

Surface-Treated Steel Plate

Referring to FIG. 1 illustrating a preferable example of the surface-treated steel plate obtained by the above-mentioned surface treatment, this surface-treated steel plate comprises a steel plate substrate 1 obtained by cold rolling, a metallic chromium layer 2 on the steel plate substrate, a non-metallic chromium layer 3 on the metallic chromium layer 2 and an ultra-thin layer 4 of a hydroxymethyl group-containing phenol or a polycondensate thereof, which is bonded to the non-metallic chromium layer 3.

The surface-treated steel plate according to the present invention is characterized in that the coating layer 4 of the above-mentioned hydroxymethyl group-containing phenol or its polycondensate is present on the chromium-containing coating layers 2 and 3, this treated layer 4 is tightly bonded to the chromium-containing coating layer 3, and the treated layer 4 is much thinner than that of a conventional lacquer coating and is an ultra-thin layer having a thickness of 1 to 100 Å, especially 1 to 30 Å.

Namely, the surface-treated steel plate of the present invention is characterized in that the hydroxymethyl group-containing phenol or its polycondensate is chemically bonded onto the chromiumcontaining coating layer 2.

When a hydroxymethyl group-containing phenol is spray-coated to the chromium-containing coating layer and is then subjected to a high-temperature treatment, even if a resin layer is formed on this treatment layer by hot melting, no strong bonding can be obtained.

Only when a hydroxymethyl group-containing phenol is applied in the gaseous phase to the chromium-containing coating layer 3 maintained at a high temperature according to the above-mentioned surface treatment process, a strong and durable bonding can be formed between the chromium-containing coating layer and a molten resin layer. Therefore, it is considered that formation of a chemical bonding between the hydroxymethyl group-containing phenol and the chromiumcontaining coating layer is important. It is said that in the surface of the chromium-containing coating layer, oxygen is coupled with chromium to form an oxolation structure (Cr—O—Cr) or an olation structure

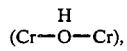

and the former oxolation structure is preferable for the water resistance and the latter olation structure is preferable for the adhesion. Since the surface-treated steel plate of the present invention has an unexpectionally high water-resistant adhesion strength, it is considered that in the surface-treated steel plate of the present invention, the hydroxymethyl group-containing phenol is chemically bonded to this oxolation structure of the chromium-containing coating layer.

Another prominent chracteristic of the surface-treated steel plate of the present invention is that the hydroxymethyl group-containing phenol or its polycondensate is present in the form of a layer much thinner than a conventional lacquer coating layer. The thickness of a conventional coating lacquer layer is ordinarily 1 to 100 microns, and it is technically difficult to reduce this thickness below 1 micron. In contrast, the layer of the hydroxymethyl group-containing phenol or its polycondensate according to the present invention is applied only in a thickness of the order of 10 Å, and by virtue of this ultra-thin layer, the bonding force or adhesion between the chroniumcontaining coating layer and the resin layer can be prominently improved. Therefore, the present invention is advantageous in various points such as the cost of the treating agent and the cost of the treating operation.

A known TFS (tin-free steel) material is preferably used as the steel plate substrate 1 having a chromium-containing coating layer 2 in the present invention.

As the TFS material, there is known a TFS material comprising a steel plate substrate such as a rolled steel plate and a chromium-containing layer of metallic chromium and/or non-metallic chromium applied to the surface of the steel plate substrate. TFS materials in which the amount coated of the chromium-containing layer is 6 to 360 mg/m², especially 10 to 250 mg/m², as chromium are readily available, but TFS materials that can be used in the present invention are not limited to these TFS materials. As the TFS material excellent in the corrosion resistance, there is preferably used a TFS material in which the chromium-containing layer comprises a metallic chromium layer on the steel plate substrate and a non-metallic chromium layer (chromium oxide and/or hydrated chromium oxide) on the metallic chromium layer, and the thickness of the metallic chromium layer corresponds to a coated amount of up to 300 mg/m², especially 10 to 200 mg/², as chromium and the thickness of the non-metallic chromium layer corresponds to a coated amount of 1 to 60 mg/m², especially 5 to 40 mg/m², as chromium.

The chromium-containing layer is ordinarily formed by carrying out an electrolytic treatment in an aqueous solution containing chromic anhydride, a complex-forming substance such as sulfuric acid, a borofluoride or a silicofluoride, a halogen ion such as a chlorine ion, an organic acid, an alcohol and a cation such as sodium or calcium by using the steel plate substrate as the cathode, and if necessary, immersing the electrolytically treated product in the above aqueous solution under non-electrolytic conditions or immersing the electrolytically treated product in a second aqueous solution containing chromic acid to effect a second stage electrolytic treatment and carrying out non-electric immersion. If an appropriate treating is selected, the chromium-containing layer may be formed only by non-electrolytic immersion.

The TFS material used may be a thin foil or a thick plate, but the thickness is ordinarily 0.01 to 0.5 mm and an appropriate material is selected form foils having a thickness of 10 to 100 microns and a sheets having a thickness of 0.10 to 0.30 mm.

In the surface-treated steel plate of the present invention, the hydroxymethyl substituted phenol is present in the form of a thin layer bonded to the chromium-containing coating layer. In some case, the hydroxymethyl substituted phenol is present in the form of a polycondensate, and this tendency is prominent when a plurality of hydroxymethyl groups are present in the phenols.

Since the surface-treated steel plate of the present invention has a very strong bonding force to various thermoplastic resins such as a polyamide, a polyester, an acid-modified polyolefin, an arylic resin, a vinyl resin and a polycarbonate, the surface-treated steel plate of the present invention is advantageously used for the production of a resin-coated steel plate or a bonded structure comprising a resin layer.

In most of commercially available chromium-treated steel plates, an oiling agent layer composed of an oiling agent such as diocyl sebacate or cotton seed oil is formed on the surface. In the present invention, a layer of the hydroxymethyl substituted phenol or its polycondensate may be formed on this oiling agent layer or may be formed on the chromium-containing coating layer after removal of the oiling agent layer by degreasing. Moreover, those skilled in the art can easily understand that the surface-treated steel plate of the present invention may be applied to various uses inthe state where an oiling agent as described above is applied to the surface of an ultra-thin layer of the hydroxymethyl substituted phenol or its polycondensate.

Bonded Structure

Figure 2:
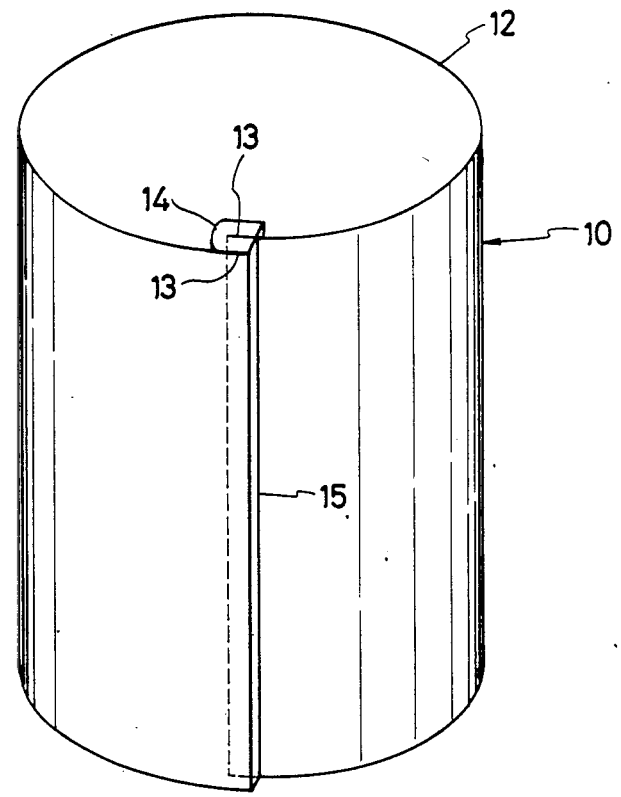
FIG. 2 is a perspective view illustrating a bonded can according to the present invention.

A side seam bonded can is shown in FIG. 2 as an example of the bonded structure of the present invention. Referring to FIG. 2, this bonded can 10 is formed by curing up a metal blank 12 in the cylindrical form, lapping both the end portions 13 and bonding the lapped end portions by a molten nylon type adhesive 14 to form a straight seam 15.

Figure 3:
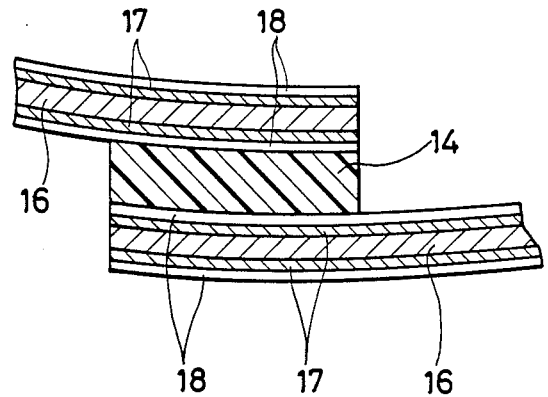
FIG. 3 is an enlarged sectional view illustrating the seam of the bonded can shown in FIG. 2.

Referring to FIG. 3 which is an enlarged sectional view of this seam 15, the material 12 comprises a steel plate substrate 16 formed by cold rolling or an aluminum sheet substrate 16, a chromium-containing coating layer 17 formed on the substrate 16 and a thin layer 18 of a hydroxymethyl substituted phenol or a polycondensate thereof which is bonded onto the chromium-containing coating layer 17.

The bonded structure of the present invention is prominently characterized in that the bonded thin layer 18 of the hydroxymethyl substituted phenol or its polycondensate is present on at least one outermost surface to be bonded of the metal blank, and the lapped end portions 13 are bonded with the polyamide type adhesive 14 through this bonded thin layer 18. As pointed out hereinbefore, in most of conventional bonded cans used for canned drinks, an adhesive primer of an epoxyphenolic resin is applied to the surface, to be bonded, of a tin-free steel (TFS) plate (electrolytically chromate-treated steel plate), and a nylon type adhesive is hot-bonded through this primer layer. When a coffee drin or fruit juice drink is hot-filled in such a bonded can or the bonded can is subjected to retort sterilization after filing of the content, the adhesion strength is reduced or reduction of the adhesion strength of the seam with the lapse of time is observed.

When this reduction of the adhesion strength by the hot water treatment or reduction of the adhesion strength with the lapse of time is examined, it is seen that the bonding force between the adhesive primer layer and the metal blank is weakened and bonding failure is caused in this portion.

According to the present invention, the bonded thin layer 18 of the hydroxymethyl substituted phenol or its polycondensate is formed on the outermost surface to be bonded of the metal blank 12 by the above-mentioned surface-treating process, and bonding is effected with a polyamide type adhesive 14 through the bonded thin layer 18. This bonded thin layer 18 has a strong bonding force or adhesion to both the metal material 12 and the nylon 14, and this strong bonding force is maintained even after the hot water treatment or after the lapse of time.

The bonded thin layer 18 of the hydroxymethyl substituted phenol or its polycondensate is much thinner than a conventional primer coating layer and has a thickness of 1 to 100 Å, especially 1 to 30 Å. the above-mentioned prominent improvement of the adhesion strength characteristics is attained by this thin thickness of the order of 10 Å.

The metal material to be used for the bonded structure of the present invention may be in the form of a foil or plate. various metal materials mentioned above with respect to the surface treatment process may be used for the fabrication of the bonded structure.

A material comprising a rolled metal substrate and a chromium-containing coating layer formed thereon in an amount coated of 6 to 360 mg/m$^2$, especially 10 to 250 mg/m$^2$, as chromium is preferred, and a steel plate material comprising a cold-rolled steel plate substrate, a metallic chromium layer formed on the substrate in an amount of up to 300 mg/m$^2$, especially 10 to 200 mg/m$^2$, as chromium and a layer of a non-metallic chromium compound (chromium oxide and/or hydrated chromium oxide) formed on the metallic chromium layer in an amount coated of 1 to 60 mg/m$^2$, especially 5 to 40 mg/m$^2$ is especially preferred.

The bonded structure of the present invention, for example, a bonded can, is prepared by forming a metal material treated according to the above-mentioned surface treatment process into a cylindrical shape by optional means, bonding confronting edges by a known hot-melt adhesive such as a polyamide type adhesive to form a side seam such as a lap seam, a lock seam and a lap-and-lock seam.

A linear homopolyamide, a copolyamide and a modified polyamide, which have a relative viscosity ($\eta$ rel) of at least 1.5, especially at least 1.8, as measured in 98% concentrated sulfuric acid at a polymer concentration of 1 g/100 cc, and a blend of two or more of these polyamides, may be used as the polyamide type adhesive. As preferred examples, there can be mentioned homopolyamides such as polyhexamethylene adipamide, polyhexamethylene sebacamide, polyhexamethylene dodecamide, polydodecamethylene decamide, poly-6-aminocaproic acid, poly-11-aminoundecanoic acid and poly-12-aminolauric acid, copolyamides comprising a combination of at least two of constituent monomers of the above-mentioned homopolyamides, that is, diamine salts of dicarboxylic acids and $\omega$-aminocarboxylic acids, and these homopolyamides and copolyamides modified with a polymeric fatty acid. Furthermore, a polyester type adhesive or a modified polyolefin type adhesive may be used.

Various means may be adopted for interposing a polyamide type adhesive between both the edges to be bonded of a can body blank. For example, a preformed tape of a polyamide type adhesive is applied to both the edges of the can body blank or a molten tape of a polyamide type adhesive is melt-extruded between the edges to be bonded. Furthermore, instead of the tape, a powder or solution of a polyamide type adhesive may be applied to the portion to be bonded of the metal material. The thickness of the polyamide type adhesive layer to be applied to the portion to be bonded is not particularly critical, so far as the polyamide type adhesive is uniformly and tightly contacted with the treatment layer on the metal material. However, it is ordinarily preferred that the thickness of the polyamide type adhesive layer be 0.01 to 0.2 mm. The polyamide type adhesive may be applied to one or both of the edge portions of the can body blank to be bonded in advance before bonding or may be located between both the edge portions at the time of bonding.

Bonding of both the edge portions of the can body blank is accomplished by melting the polyamide type adhesive located between both the confronting edge portions of the can body blank formed into a cylindrical shape and pressing both the edge portions of the can body blank under cooling to solidify the polyamide type adhesive. The can body formed by this side lap bonding is subjected to known can-making steps such as notching, flanging and lid-double-seaming to obtain a final can body.

The procedures of the production of bonded cans are described in Journal of Japanese Adhesive Association, vol. 11, No. 2, pages 26–31 (1975).

The bonded structure of the present invention is effectively applied to not only the production of the above-mentioned bonded can but also bonding of a lid to a can body and bonding of a plurality of optional metal parts.

The present invention will now be described in detail with reference to the following examples that by no means limit the scope of the invention.

EXAMPLE 1

A tin-free steel (TFS) plate (Hi-Top ® supplied by Toyo Kohan) having a metallic chromium coated amount of 112 mg/m$^2$, a non-metallic chromium coated amount of 14 mg/m$^2$ as chromium and a thickness of 0.17 mm was used as the substrate, and phenol, p-cresol, bisphenol A, saligenin, di-hydroxymethyl p-cresol (mononuclear compound) or 1,1'-dihyroxy-2,2'-dihydroxy-4,4'-dimethyldiphenylmethane (binuclear compound) (each having a purity of at least 99%) was applied to the substrate according to any of the following methods.

(a) The agent was dissolved in chloroform, the solution was coated on the TFS plate so that the thickness of the coating after drying was abou 1 μm, and the coating was dried at 100° C. for 10 minutes.

(b) The agent was coated int he same manner as described in (a) above, and the coating was dried at 200° C. for 10 minutes.

(c) In a bottom portion of a lidded metal vessel having a diameter of about 15 cm and a height of about 15 cm, about 1 g of the agent was placed, and simultaneously, small pieces of TFS supported by a glass holder were placed in the bottom portion of the vessel so that they were not contacted with each other. The lid was sealed and the vessel was heated at 200° C. for 10 minutes.

The so-treated plates were heat-bonded by using a polyamide type adhesive (nylon 12 film having a thickness of 80 μm, supplied by Toray), and the T-peel strength was measured. The obtained results are shown in Table 1.

From the results shown in Table 1, it is seen that only when the agent having a methylol group was coated in the gaseous phase, a high bonding strength exceeding 2.5 kg/5 mm was obtained.

TABLE 1

| Agent | Molecular Weight | T-Peel Strength (kg/5 mm) | | | Thickness (Å) |
|---|---|---|---|---|---|
| | | (a) 100° C. × 10 minutes | (b) 200° C. × 10 minutes | (c) 200° C. × 10 (minutes (gaseous phase) | |
| Phenol | 94 | 2.3 | 1.1 | 2.1 | 1.1 |
| p-Cresol | 108 | 2.0 | 0.5 | 2.4 | 1.2 |
| Bisphenol A | 228 | — | 0.8 | 2.0 | 2.1 |
| Saligenin | 124 | 2.3 | 1.6 | 4.8 | 12.2 |
| Mononuclear compound | 168 | 3.0 | 1.4 | 4.8 | 10.4 |
| Binuclear compound | 260 | 2.1 | 1.0 | 5.0 | 8.7 |
| Blank | — | | 1.1 | | 0 |

EXAMPLE 2

The same di-hydroxymethyl p-cresol (molecular weight =168) as used in Example 1 was coated in the gaseous phase on the same TFS plate as used in Example 1 at a heating temperature shown below for 10 minutes according to the method (c) described in Example 1. The bonding strength was measured in the same manner as described in Example 1. The obtained results are shown in Table 2.

TABLE 2

| Heating Temperature (°C.) | T-Peel Strength (kg/5 mm) |
|---|---|
| 140 | 1.5 |
| 150 | 3.0 |
| 160 | 2.6 |
| 170 | 3.1 |
| 180 | 4.0 |
| 190 | 4.0 |
| 200 | 5.0 |
| 210 | 4.9 |
| 220 | 5.4 |
| 230 | 5.5 |
| 240 | 5.5 |
| 250 | 5.0 |
| 300 | 4.5 |

EXAMPLE 3

The procedures of Example 2 were repeated in the same manner except that the coating thickness was changed as indicated below by increasing or decreasing the amount of the dimethylol placed in the metal vessel for the gaseous phase coating or by conducting the coating operation repeatedly. The T-peel strength was determined in the same manner as described in Example 1. the obtained results are shown in Table 3.

TABLE 3

| Thickness (Å) | T-Peel Strength (kg/5 mm) |
|---|---|
| 0 | 1.1 |
| 1.0 | 3.5 |
| 12.2 | 5.0 |
| 18.7 | 5.3 |

TABLE 3-continued

| Thickness (Å) | T-Peel Strength (kg/5 mm) |
|---|---|
| 28.5 | 4.9 |
| 64.5 | 4.2 |
| 98.1 | 4.3 |

EXAMPLE 4 AND COMPARATIVE EXAMPLE 1

A tin-free steel plate having a thickness of 0.20 mm (metallic chromium amount of 108 mg/m² and non-metallic chromium amount of 16 mg/m²) was coated in the gaseous phase at 200° C. in the same manner as described in Example 2. The coating thickness was 12.2 Å.

Separately, an epoxy-phenolic lacquer having a good adhesiveness (proposed in Japanese Patent Application Laid-Open Specification No. 166398/81) was coated on the same tin-free steel plate as described above so that the coating thickness after drying was 5 μm, and the coating was baked at 210° C. for 10 minutes.

Both the coated steel plates were independently bonded in the same manner as described in Example 1, and the bonded structures were maintained at 90° C. in a 0.4% aqueous solution of citric acid and the change of the bonding force was examined.

The change of the T-peel strength is shown in Table 4.

TABLE 4

| | T-Peel Strength (kg/5 mm) | |
|---|---|---|
| | Example 4 | Comparative Example 1 |
| before immersion | 6.1 | 6.2 |
| after 1 day's immersion | 5.4 | 4.4 |
| after 2 days' immersion | 4.9 | 2.6 |
| after 3 days' immersion | 4.5 | 1.6 |
| after 4 days' immersion | 4.4 | 1.3 |
| after 5 days' immersion | 3.8 | 1.4 |

EXAMPLE 5 AND COMPARATIVE EXAMPLE 2

Di-hydroxymethyl p-cresol was coated in the gaseous phase at 200° C. on a commercially available aluminum plate (Aluminum 5052 having a thickness of 0.30 mm). The coating thickness was 13.8 Å.

Separately, an epoxy-phenolic lacquer having a good adhesiveness (proposed in Japanese Patent Application Laid-Open Specification No. 166398/81) was coated on the same aluminum plate as described above so that the coating thickness after drying was 5 μm, and the coating was baked at 210° C. for 10 minutes.

The degradation of the bonding force in both the coated aluminum plates was examined in the same manner as described in Example 4. The obtained results are shown in Table 5.

TABLE 5

| | T-Peel Strength (kg/5 mm) | |
|---|---|---|
| | Example 5 | Comparative Example 2 |
| before immersion | 5.5 | 6.1 |
| after 1 day's immersion | 4.0 | 3.0 |
| after 2 days' immersion | 3.3 | 1.8 |
| after 3 days' immersion | 3.2 | 1.3 |
| after 4 days' immersion | 3.1 | 1.2 |
| after 5 days' immersion | 3.1 | 1.2 |

EXAMPLE 6 AND COMPARATIVE EXAMPLE 3

Saligenin was coated in the gaseous phase at 200° C. for 10 minutes on a nickel-deposited steel plate (Canwel ® supplied by Nippon Steel) having a thickness of 0.24 mm according to the method (c) described in Example 1. The coating thickness was 10.7 Å. The sample was bonded in the same manner as in Example 1, and the bonded structure was maintained at 90° C. in a 0.4% aqueous solution of citric acid and the change of the bonding force was examined.

The nickel-deposited steel plate which had not been coated in the gaseous phase with saligenin was similarly bonded and the degradation of the bonding force with the lapse of time was examined.

The change of the T-peel strength is shown in Table 6.

TABLE 6

| | T-Peel Strength (kg/5 mm) | |
|---|---|---|
| | Example 6 | Comparative Example 3 |
| before immersion | 4.8 | 2.8 |
| after 1 day's immersion | 3.5 | 1.5 |
| after 3 days' immersion | 2.5 | 0.5 |
| after 5 days' immersion | 2.3 | 0.4 |
| after 7 days' immersion | 2.2 | 0.3 |

EXAMPLE 7 AND COMPARATIVE EXAMPLE 4

An oiling agent-applied low-carbon steel plate having a thickness of 0.22 mm was degreased with trichloroethylene, electrolytically degreased in 5% NaOH pickeled in a 1% H₂SO₄ solution and washed with water. Then, the steel plate was immersed in 3% chromic acid at 25° C. for 5 seconds, washed with water and dried. In the same manner as described in Example 6 and Comparative Example 3, the so-treated steel plate was coated in the gaseous phase and bonded and the degradation of the bonding force with the lapse of time was examined. The obtained results are shown in Table 7. Incidentally, the coating thickness was 29.7 Å.

TABLE 7

| | T-Peel Strength (kg/5 mm) | |
|---|---|---|
| | Example 7 | Comparative Example 4 |
| before immersion | 6.4 | 1.1 |
| after 1 day's immersion | 4.0 | 0.5 |
| after 3 days' immersion | 1.5 | 0.1 |
| after 5 days' immersion | 1.0 | — |
| after 7 days' immersion | 0.8 | — |

EXAMPLE 8 AND COMPARATIVE EXAMPLE 5

By using the chromic acid-immersed steel plate prepared in Example 7, the following experiment was carried out.

Saligenin was coated in the gaseous phase on the steel plate at 200° C. for 10 minutes according to the method (c) described in Example 1. The coating thickness was 29.7 Å.

A maleic acid-modified polypropylene film having a thickness of 40 μm (Liothene ® M4 supplied by Toyo Ink) was interposed between sample plates, and the assembly was hot-pressed and the T-peel strength was measured. The bonded structure was maintained at 90° C. in a 0.4% aqueous solution of citric acid, and the change of the bonding force was examined.

The chromic acid-immersed steel plates, which had not been subjected to the gaseous phase coating treatment, were similarly bonded, and the degradation of the bonding force was examined.

The obtained results are shown in Table 8.

TABLE 8

| | T-Peel Strength (kg/5 mm) | |
|---|---|---|
| | Example 8 | Comparative Example 5 |
| before immersion | 3.5 | 1.9 |
| after 1 day's immersion | 3.2 | 2.0 |
| after 3 days' immersion | 3.0 | 1.8 |
| after 5 days' immersion | 3.4 | 1.9 |
| after 7 days' immersion | 3.3 | 1.8 |

EXAMPLE 9

A steel plate having a metallic chromium coated amount of 102 mg/m$^2$ and a non-metallic chromium coated amount of 12 mg/m$^2$ (Cansupar ® supplied by Nippon Steel) was used instead of the steel plate used in Example 1 (Hi-Top ® supplied by Toyo Kohan), and di-hydroxymethyl p-cresol (mononuclear compound), saligenin or 1,1'-dihydroxy-2,2'-dihydroxy-4,4'-dimethyldiphenylmethane (binuclear compound) was applied to the steel plate according to the method (c) described in Example 1. The steel plates were press-bonded in the same manner as described in Example 1. The T-peel strength was measured in the same manner as in Example 1. The obtained results are shown in Table 9.

TABLE 9

| Agent | Molecular Weight | Thickness (Å) | T-Peel Strength (kg/5 mm) |
|---|---|---|---|
| Saligenin | 124 | 12.2 | 4.7 |
| Mononuclear Compound | 168 | 10.4 | 4.8 |
| Binuclear Compound | 260 | 8.7 | 4.8 |
| Blank | — | 0 | 1.4 |

EXAMPLE 10 AND COMPARATIVE EXAMPLE 6

The procedures of Example 7 and Comparative Example 4 were repeated in the sme manner except that a maleic acid-modified polypropylene film having a thickness of 40 μm (Liothene ® M4 supplied by Toyo Ink) was used as the adhesive film for the heat-bonding. The obtained results are shown in Table 10.

TABLE 10

| | T-Peel Strength (kg/5 mm) | |
|---|---|---|
| | Example 10 | Comparative Example 6 |
| before immersion | 3.5 | 1.9 |
| after 1 day's immersion | 3.2 | 2.0 |
| after 3 days' immersion | 3.0 | 1.8 |
| after 5 days' immersion | 3.4 | 1.9 |
| after 7 days' immersion | 3.3 | 1.8 |

EXAMPLE 11 AND COMPARATIVE EXAMPLE 7

A tin-free steel plate having a metallic chromium coated amount of 110 mg/m$^2$, a non-metallic chromium coated amount of 15 mg/m$^2$ as chromium and a thickness of 0.20 mm (Hi-Top ® supplied by Toyo Kohan) was cut into a size suitable for the production of a can body of a can having a volume of 250 ml and was then treated according to the following method.

(a) In a thin iron plate vessel having a capacity capable of containing the above-mentioned blank therein, five blanks were supported by a glass holder so that they were not contacted with one another, and 1 g of dihydroxymethyl p-cresol (mononuclear compound having a molecular weight of 168) was placed in the bottom portion of the vessel. Heating was conducted at 200° C. for 10 minutes. The thickness of the organic film vapor-deposited on the surface of the tin-free steel plate was 16±2 Å.

(b) An epoxy-phenolic lacquer having a good adhesiveness to tin-free steel (proposed in Japanese Patent Application Laid-Open Specification No. 166398/81) was coated on the top and bottom faces of the above blank so that the thickness of the coating layer was 5 μm. The coating on the top face was baked at 185° C. for 10 minutes and the coating on the bottom face was baked at 210° C. for 10 minutes to obtain a steel plate having both the surface coated.

Rectangular blanks treated according to the above-mentioned method (a) or (b) were lap-bonded while kaking a bonding margin of 5 mm on each of the confronting short side ends of the rectangular blank.

A nylon 12 film having a width of 5 mm and a thickness of 40 μm (supplied by Toray) was used as the adhesive and the end portions were bonded according to the heat-melt-bonding method.

A side seam bonded portion of the obtained can body was cut out and the T-peel strength was measured. The bonded portion was immersed in a 0.4% aqueous solution of citric acid at 90° C. and the degradation of the bonding force with the lapse of time was examined.

A can bottom end was double-seamed to the above can body according to conventional procedures, coffee was filled at 95° C., and a can top end was double-seamed to the filled can body. Ten of the so-obtained sample cans were heatsterilized at 135° C. The breaking of the bonded portion (breaking of the can body) was checked while changing the heating time.

The obtained results are shown in Tables 11 and 12.

TABLE 11

| | T-Peel Strength (kg/5 mm) | |
|---|---|---|
| | Example 11 | Comparative Example 7 |
| before immersion | 6.4 | 6.5 |
| after 1 day's immersion | 5.8 | 4.7 |
| after 2 days' immersion | 5.2 | 3.0 |
| after 3 days' immersion | 4.8 | 2.2 |
| after 4 days' immersion | 4.5 | 1.8 |
| after 5 days' immersion | 4.6 | 1.4 |

TABLE 12

| Heat Sterilization Time (minutes) | Number of Broken Can Bodies in 10 Tested Samples | |
|---|---|---|
| | Example 11 | Comparative Example 7 |
| 120 | 0 | 0 |
| 240 | 0 | 0 |
| 360 | 0 | 8 |
| 480 | 0 | 10 |
| 600 | 0 | — |
| 900 | 0 | — |

EXAMPLE 12 AND COMPARATIVE EXAMPLE 8

Two kinds of samples were prepared from an aluminum plate having a thickness of 0.30 mm and a chromium coated amount of 15 mg/m$^2$ (Aluminum 5052 supplied by Sumitomo Light Metal) in the same manner as described in Example 11, and cylindrical can bodies were prepared from these samples in the same manner as described in Example 11. The side seam bonded portions were cut out and the T-peel strengths were measured.

Furthermore, the bonded portions were maintained at 90° C. in a 0.4% aqueous solution of citric acid, and the degradation of the bonding forth was examined.

The obtained results are shown in Table 13.

TABLE 13

|  | T-Peel Strength (kg/5 mm) | |
| --- | --- | --- |
|  | Example 12 | Comparative Example 8 |
| before immersion | 6.2 | 5.9 |
| after 1 day's immersion | 5.4 | 3.8 |
| after 2 days' immersion | 4.2 | 2.1 |
| after 3 days' immersion | 3.6 | 1.4 |
| after 4 days' immersion | 3.4 | 1.1 |
| after 5 days' immersion | 3.1 | 1.0 |

We claim:

1. A process for surface treatment of metal materials, which comprises applying a hydroxymethyl substituted phenol in gaseous phase to the surface of a metal material maintained at a high temperature.

2. A process according to claim 1, wherein the surface of the metal material is maintained at a temperature higher than 150° C.

3. A process according to claim 1, wherein the hydroxymethyl substituted phenol has a molecular weight of 124 to 320.

4. A process according to claim 1, wherein the hydroxymethyl substituted phenol is represented by the following general formula:

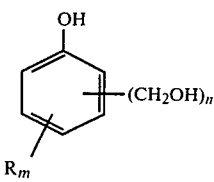

wherein R stands for a hydrogen atom, an alkyl group, a hydroxyl group or a phenyl group, n is an integer of from 1 to 3, and m is an integer of from 1 to 3, with the proviso that the sum of m and n does not exceed 5, and it is preferred that the hydroxymethyl group be bonded at the ortho- or para-position to the phenolic hydroxyl group.

5. A process according to claim 1, wherein the hydroxymethyl substituted phenol is a hydroxymethyl substituted binuclear phenol represented by the following general formula:

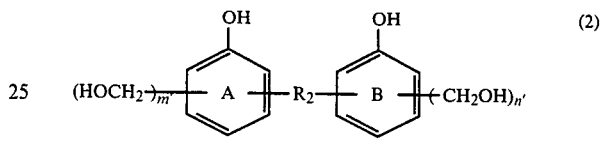

wherein $R_2$ stands for a direct bond or a divalent bridging group, each of n' and m' is an integer of up to 2 inclusive of 0, with the proviso that the sum of n' and m' is an integer of at least 1, and rings A and B may be substituted with a methyl group.

6. A process according to claim 1, wherein the treatment with the hydroxymethyl substituted phenol is carried out so that the thickness of the formed treatment coating layer is 1 to 100 Å.

7. A process according to claim 1, wherein the metal material is introduced in a heat treatment furnace and is exposed to a high-temperature atmosphere containing a vapor of the hydroxymethyl substituted phenol.

8. The process of claim 1 wherein the metal material is a tin-free steel having a chromium-containing coating layer composed of metallic chromium, non-metallic chromium or a mixture thereof on at least the surface thereof to which the hydroxymethyl substituted phenol is applied.

* * * * *